(12) United States Patent
Hsieh

(10) Patent No.: US 10,305,502 B2
(45) Date of Patent: *May 28, 2019

(54) COMPLEMENTARY CURRENT REUSING PREAMP FOR OPERATIONAL AMPLIFIER

(71) Applicant: Texas Instruments Incorporated, Dallas, TX (US)

(72) Inventor: Tien-Ling Hsieh, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/027,669

(22) Filed: Jul. 5, 2018

(65) Prior Publication Data

US 2018/0316360 A1 Nov. 1, 2018

Related U.S. Application Data

(63) Continuation of application No. 14/744,344, filed on Jun. 19, 2015, now Pat. No. 10,044,362.

(60) Provisional application No. 62/014,543, filed on Jun. 19, 2014.

(51) Int. Cl.
| | |
|---|---|
| *H03F 3/45* | (2006.01) |
| *H03M 1/12* | (2006.01) |
| *H03F 1/42* | (2006.01) |
| *H03G 1/00* | (2006.01) |

(52) U.S. Cl.
CPC .............. *H03M 1/12* (2013.01); *H03F 1/42* (2013.01); *H03F 3/45183* (2013.01); *H03F 3/45237* (2013.01); *H03F 3/45565* (2013.01); *H03F 2200/36* (2013.01); *H03F 2200/411* (2013.01); *H03F 2203/45112* (2013.01); *H03F 2203/45116* (2013.01); *H03F 2203/45418* (2013.01); *H03F 2203/45424* (2013.01); *H03F 2203/45644* (2013.01); *H03F 2203/45674* (2013.01); *H03F 2203/45702* (2013.01); *H03G 1/0029* (2013.01)

(58) Field of Classification Search
CPC ....... H03F 3/45179; H03F 2203/45028; H03F 1/3211; H03F 3/45632; H03F 3/4565; H03F 3/45654; H03F 1/34; H03F 2200/18; H03F 2200/27; H03F 3/345; H03F 2203/45182; H03F 2203/45188; H03F 2203/45192; H03F 2203/45244
USPC ................... 341/135–137, 155; 330/253, 257
See application file for complete search history.

(56) References Cited

U.S. PATENT DOCUMENTS 4,485,349 A * 11/1984 Siegel ....................... H03F 1/30
330/145
5,515,003 A * 5/1996 Kimura ............... H03F 3/45179
330/253

(Continued)

*Primary Examiner* — Linh V Nguyen
(74) *Attorney, Agent, or Firm* — John R. Pessetto; Charles A. Brill; Frank D. Cimino

(57) ABSTRACT

An apparatus includes a preamplifier stage to receive a power supply voltage and generate an output based upon an input. In particular, the preamplifier stage includes a biasing device coupled between the output and a ground node to bias a DC voltage level of the output independently of the power supply voltage. The preamplifier stage also includes a complementary circuit to receive the input and generate the output. The complementary circuit reuses a current through the preamplifier stage to provide an increased transconductance of the preamplifier stage for a given current level.

6 Claims, 5 Drawing Sheets

(56) References Cited

U.S. PATENT DOCUMENTS

| | | | |
|---|---|---|---|
| 5,936,466 A * | 8/1999 | Andoh | H03F 3/45659 |
| | | | 327/359 |
| 5,990,742 A * | 11/1999 | Suzuki | H03F 3/3001 |
| | | | 330/253 |
| 6,046,638 A * | 4/2000 | Hogeboom | H03K 5/2481 |
| | | | 330/252 |
| 6,897,726 B2 | 5/2005 | Tsuchi | |
| 6,970,022 B1 * | 11/2005 | Miller | H03K 3/3565 |
| | | | 327/205 |
| 7,639,724 B2 | 12/2009 | Tso et al. | |
| 10,044,362 B2 * | 8/2018 | Hsieh | H03F 1/42 |
| 2001/0052818 A1 | 12/2001 | Suzuki | |
| 2003/0095003 A1 * | 5/2003 | Li | H03F 3/45219 |
| | | | 330/253 |
| 2003/0222705 A1 | 12/2003 | Tamura et al. | |
| 2004/0239423 A1 | 12/2004 | Hwang et al. | |
| 2005/0001681 A1 * | 1/2005 | Chen | H03F 3/345 |
| | | | 330/253 |
| 2005/0088224 A1 | 4/2005 | Ookawa | |
| 2005/0248405 A1 * | 11/2005 | Tsuchi | G09G 3/2011 |
| | | | 330/257 |
| 2006/0139066 A1 * | 6/2006 | Kwon | H03F 3/45237 |
| | | | 327/112 |
| 2012/0072476 A1 * | 3/2012 | Bucci | H01L 23/544 |
| | | | 708/270 |
| 2012/0127138 A1 * | 5/2012 | Tsuchi | H03F 1/0261 |
| | | | 345/204 |
| 2013/0241632 A1 | 9/2013 | Inoue | |
| 2013/0300501 A1 * | 11/2013 | Kao | H03F 3/3022 |
| | | | 330/253 |

* cited by examiner

COMPLEMENTARY CURRENT REUSING PREAMP FOR OPERATIONAL AMPLIFIER

CROSS-REFERENCE TO RELATED APPLICATIONS

This continuation application claims priority to U.S. patent application Ser. No. 14/744,344, filed Jun. 19, 2015, which claims priority to Provisional Patent Application No. 62/014,543, filed Jun. 19, 2014, both of which are hereby incorporated herein by reference in their entirety.

BACKGROUND

Various electronic devices, such as an analog-to-digital converter (ADC), require amplification of a signal before subsequent processing of that signal. Such amplification may be accomplished through the use of a multiple-stage amplification design, in which a preamplifier or a preamp stage is utilized to boost the overall amplifier bandwidth. Conventional preamp stages often include a coupling between a power supply for the preamp stage and the output of the preamp stage. As a result, any variation or noise introduced by the power supply will cause fluctuations in an output voltage of the preamp stage, further introducing noise into subsequent amplifier stages, which is not desirable.

BRIEF DESCRIPTION OF THE DRAWINGS

For a detailed description of various examples, reference will now be made to the accompanying drawings in which.

DETAILED DESCRIPTION

Figure 1:
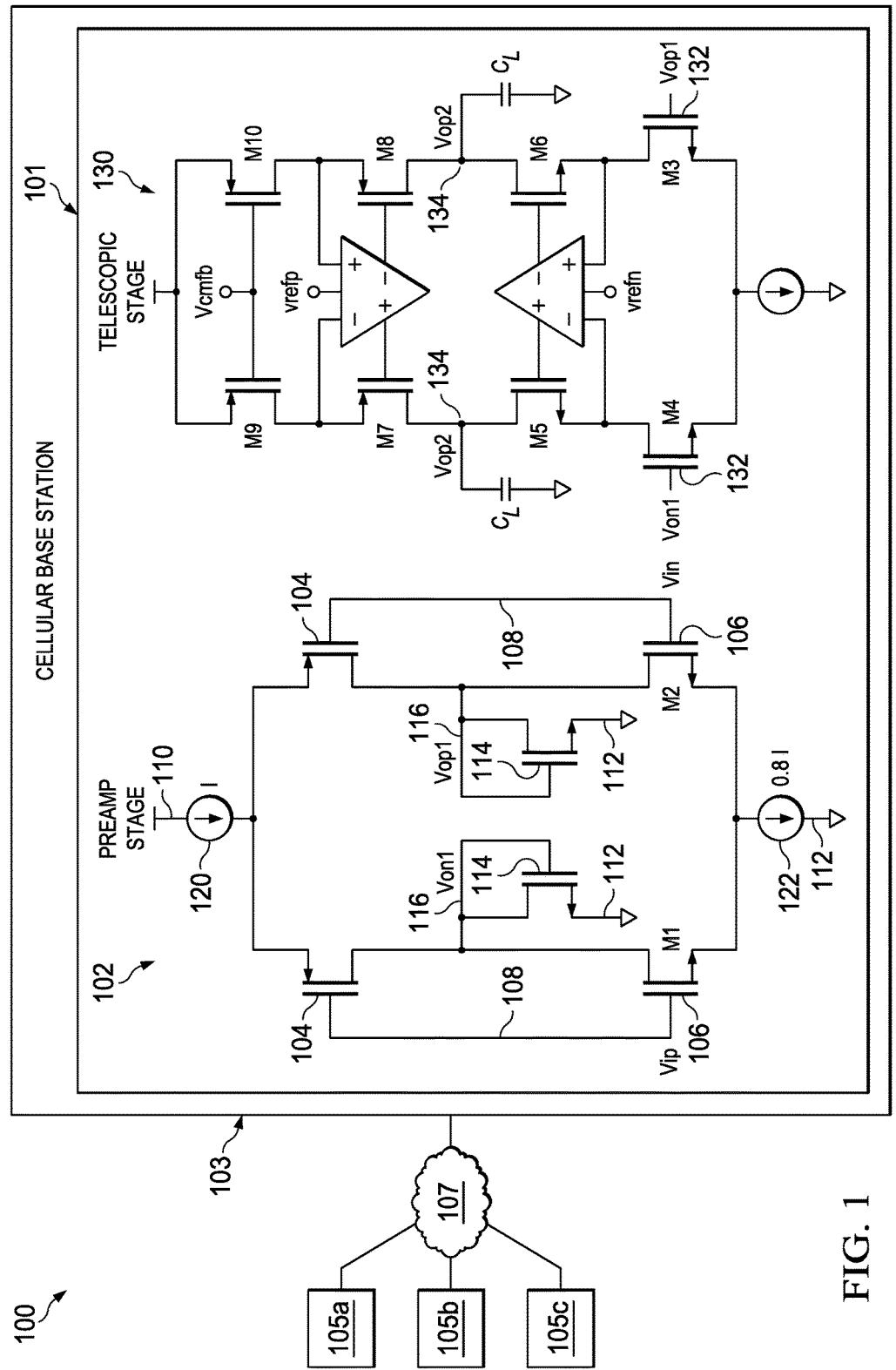
FIG. 1 shows an exemplary circuit diagram of a preamplifier stage and telescopic stage in accordance with various examples.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

As explained above, devices such as analog-to-digital converters (ADC) require amplification of a signal before subsequent processing of that signal, which may include the use of a preamp stage. Variations or noise introduced by a power supply to the preamp stage cause fluctuations in an output voltage of the preamp stage. For example, an increase in the power supply voltage will result in a corresponding increase in the preamp stage output voltage; similarly, a decrease in the power supply voltage will result in a corresponding decrease in the preamp stage output voltage. This behavior is not desirable, since the output tracking variations in the power supply will be multiplied by subsequent amplification stages, resulting in an increase in overall noise (e.g., signal-to-noise ratio (SNR)) of the ADC.

Various examples of the present disclosure are directed to a preamp stage that may be used, for example, in a high-speed and high-accuracy ADC in various contexts, such as cellular base stations (e.g., with multicarrier systems), automatic test equipment (ATE), high-end instrumentation, military, or aerospace. In accordance with examples of the present disclosure, the preamp stage provides a more stabilized output voltage that is less dependent on a power supply voltage, and thus reduces the transmission of variations or noise from the power supply to a subsequent amplifier stage. Further, the presently-disclosed preamp stage provides an increased transconductance relative to prior art designs without a corresponding increase in current consumption. In other examples of the present disclosure, the preamp stage provides a comparable transconductance but with a reduced current consumption relative to prior art designs. A greater transconductance for a given amount of current or power consumption results in a correspondingly increased DC gain for the preamp stage, which in turn results in a larger amplifier bandwidth without a corresponding increase in power consumption. Of course, in other examples the preamp stage allows for an amplifier bandwidth similar to prior art designs, but with reduced power consumption for the given bandwidth.

Conventionally, a low-gain preamp stage could be utilized to boost the overall amplifier bandwidth. However, this preamp stage typically only utilized an NMOS differential input pair because PMOS counterparts were much slower (e.g., on the order of twice as slow). Unlike prior art preamp stage designs, examples of the present disclosure leverage improvements to CMOS technology that enable the use of PMOS devices having transconductance and parasitic behavior similar to their NMOS counterparts even when operated at high speeds (e.g., approaching 1 GHz or higher). As will be explained in further detail below, examples of the present disclosure utilize a complementary preamp design that utilizes both PMOS and NMOS devices to provide an increase in transconductance of the preamp stage (and thus amplifier bandwidth) for a given current or power consumption. Further, examples of the present disclosure employ a diode-connected device between the preamp load and ground, which biases the output of the preamp stage to reduce common mode output voltage dependence on power supply voltage variation or noise. That is, the output of the preamp stage is biased independently of the power supply. Certain examples include an analog-to-digital converter (ADC) that employs a preamp stage in accordance with the present disclosure.

Turning now to FIG. 1, a system 100 is shown in accordance with various examples. The system 100 includes an electronic device 101 such as an ADC or other device that benefits from signal amplification using a preamp stage 102. As explained above, the ADC 101 may be a component of a cellular base station 103, which communicates with one or more cellular devices 105a-c over a wireless network 107. In accordance with various examples of the present disclosure, the preamp stage 102 includes a PMOS differential pair 104 and an NMOS differential pair 106, whose gates are coupled to an input 108 (also labeled Vip and Vin) to the preamp stage 102. The PMOS differential pair 104 is located at the power supply 110 side while the NMOS differential pair 106 is located at the ground 112 side. By providing the PMOS differential pair 104 at the power supply 110 side, a complementary circuit is created in which current through the preamp stage 102 is in effect reused to provide an increased transconductance for the preamp stage 102 for a given current or power consumption.

Further, diode-connected devices 114 are located between the preamp load 116 (also labeled Von1 and Vop1) and ground 112, which biases the output 116 of the preamp stage 102 to reduce dependence of the common mode output voltage 116 on power supply 110 voltage variation or noise. In the shown example, the diode-connected devices 114 are two-terminal rectifying devices created by connecting the gate and drain of an NMOS device, such that they are always in the saturation region. The preamp output 116 may be applied to a subsequent amplification stage, such as telescopic stage 130 as inputs 132. The telescopic stage 130 provides further amplification to the signal and generates outputs 134. Thus, by reducing the dependence of the common mode output voltage 116 on the preamp stage 102 power supply 110, overall noise (e.g., SNR) of the ADC 101 is reduced, which is beneficial.

Current sources 120, 122 are shown for exemplary purposes and demonstrate that a large majority of the current flowing through the preamp stage 102 flows through the PMOS and NMOS differential pairs 104, 106, while only a small portion of the current sinks into the diode-connected devices 114. Thus, a large majority of the current is shared between the PMOS and NMOS differential pairs 104, 106, resulting in an additive transconductance effect. That is, the total transconductance for the preamp stage 102 is equal to the transconductance of the PMOS differential pair 104 plus the transconductance of the NMOS differential pair 106. In this way, a higher transconductance is achieved relative to the prior art design, in which only transconductance for the NMOS differential pair 102 is attainable, but without requiring an increase in current or power consumption. Similarly, as explained above, a similar transconductance may be achieved by the preamp stage 102 but with a reduction in current or power consumption by almost half.

In certain examples of the present disclosure, the current sources 120, 122 comprise short-channel devices. In these examples, the current injected into the diode-connected devices 114 between the preamp load 116 and ground 112 may be controlled using the channel length modulation effect, and thus the voltage on the diode-connected load 116 may be controlled. For example, the voltage on the diode-connected load 116 is given by the current injected into the diode-connected devices 114 divided by the transconductance of the devices 114. Thus, the voltage on the diode-connected load 116 is now uncorrelated to the power supply 110 voltage and is instead tied to the characteristics of the diode-connected devices 114, which are fixed. In some cases, the voltage on the diode-connected load 116 is accurate within several tens of millivolts.

Figure 2B:
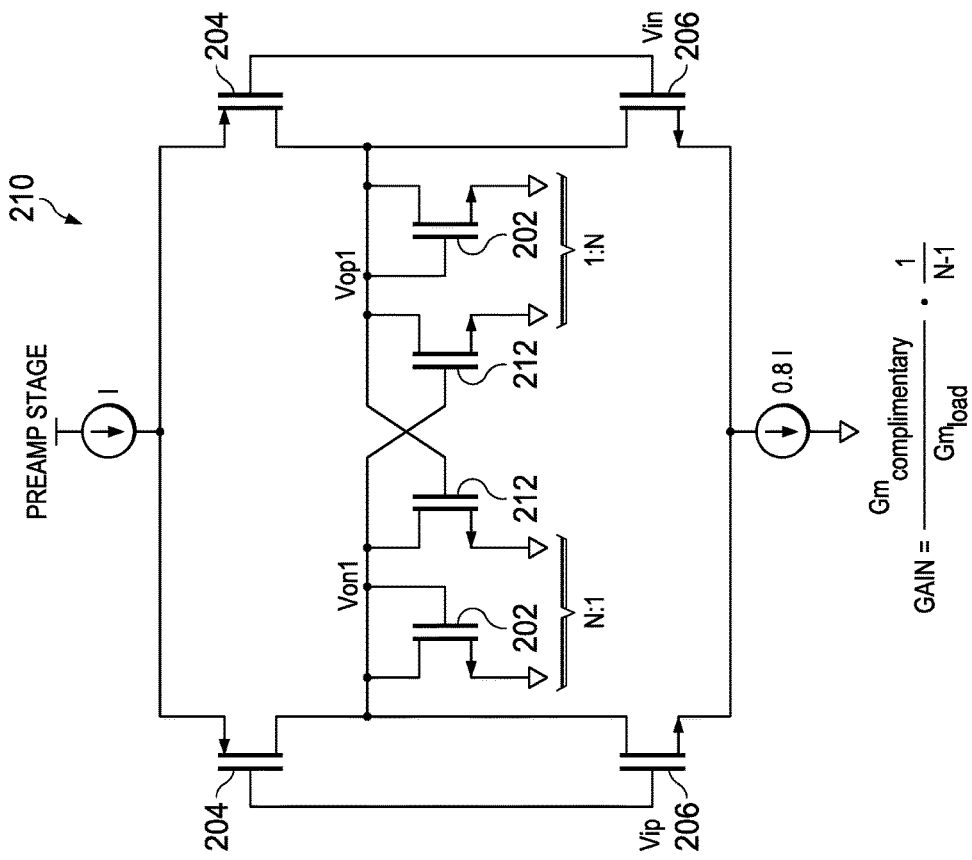
FIGS. 2a-c show exemplary circuit diagrams to vary a gain of a preamplifier stage in accordance with various examples.
Figure 2A:
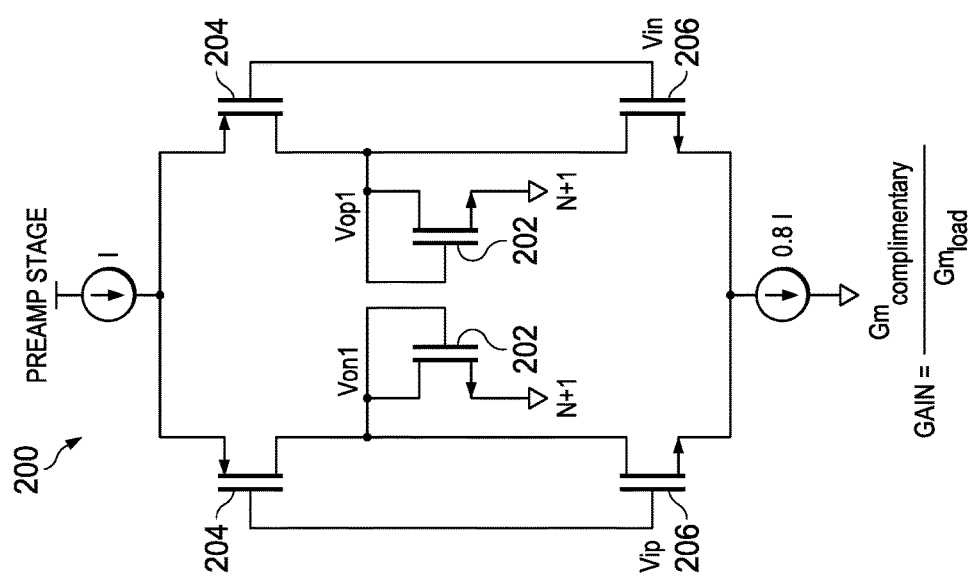
Figure 2C:
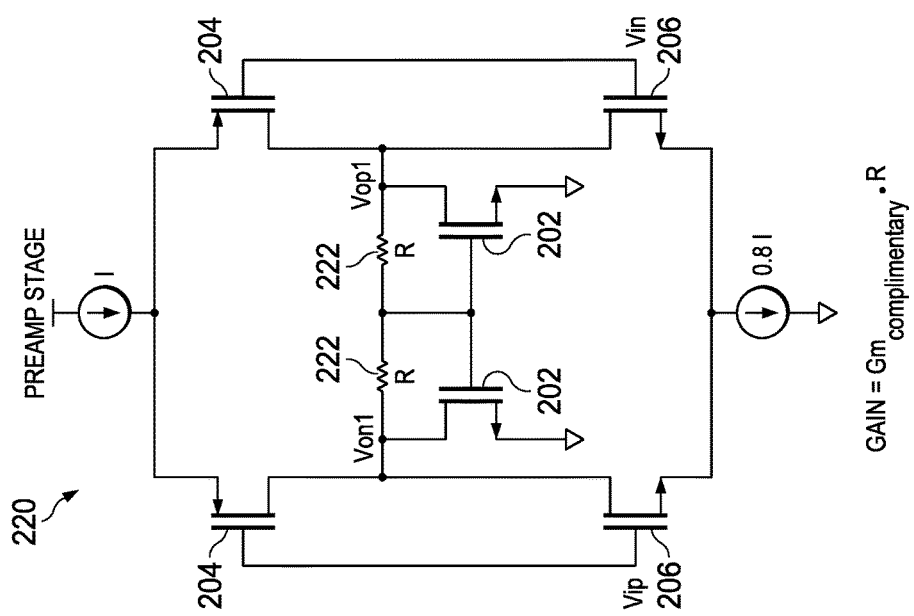

Turning now to FIGS. 2a-c, alternate examples 200, 210, 220 of the preamp stage 202 are shown. The examples 200, 210, 220 demonstrate various ways in which the gain of the preamp stage 102 may be adjusted. In FIG. 2a, a gain of the exemplary preamp stage 200 may be controlled by appropriately sizing the diode-connected devices 202. It will be appreciated that the gain of the preamp stage 200 is given by the ratio of transconductance of the complementary devices (i.e., the PMOS differential pair 204 and the NMOS differential pair 206) to the transconductance of the diode-connected load 202. Put another way, the gain of the preamp stage 200 is equal to Gm(complementary) divided by Gm(load).

In FIG. 2b, a gain of the exemplary preamp stage 210 may be controlled by introducing a cross-couple circuit, shown as cross-coupled devices 212, to the diode-connected load 202. In particular, the ratio of transconductance of the diode-connected devices 202 to the cross-coupled devices 212 influences the gain of the preamp stage 210. In some examples, this is referred to also as a size of the device 202, 212. For example, assume the ratio of size of the diode-connected devices 202 to the cross-coupled devices 212 is N:1. In this case, the gain of the preamp stage 210 is given by the ratio of transconductance of the complementary devices (i.e., the PMOS differential pair 204 and the NMOS differential pair 206) to the transconductance of the diode-connected load 202 divided by N−1. In one particular example, where the cross-coupled devices 212 are sized equivalently to the diode-connected devices 202, the gain of the preamp stage 210 is infinite because the ratio of transconductance is effectively subject to division by 0.

In FIG. 2c, a gain of the exemplary preamp stage 220 may be controlled by introducing a resistive feedback element or circuit, shown as resistors 222 coupled to the diode-connected devices 202. In this example, the gain of the preamp stage 220 will be equal to the transconductance of the complementary devices (i.e., the PMOS differential pair 204 and the NMOS differential pair 206) times the resistance of resistors 222 for. Of course, the foregoing preamp stages 200, 210, 220 are only examples of ways in which the gain of the preamp stage may be adjusted, and the present disclosure is intended to encompass other examples of adjusting the gain of the preamp stage as well.

Figure 3:
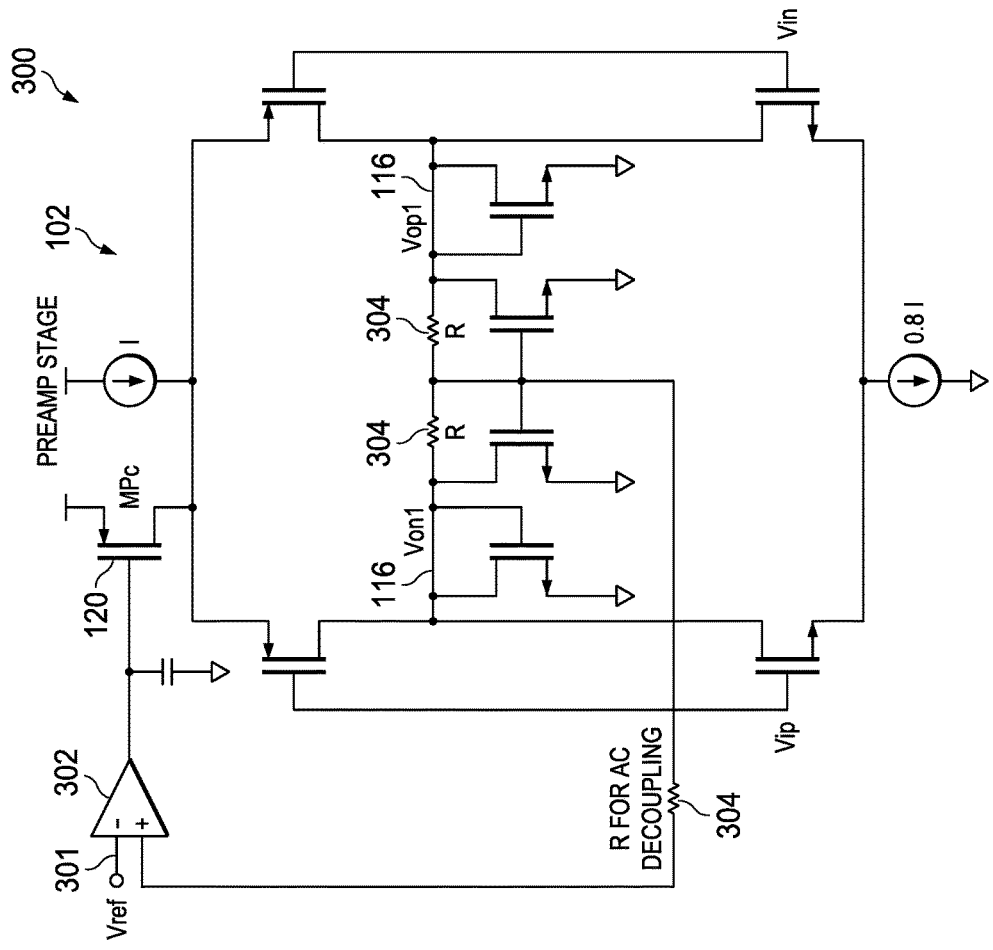
FIG. 3 shows an exemplary circuit diagram of a feedback loop to control an output voltage bias of a preamplifier stage in accordance with various examples.

FIG. 3 shows a feedback loop 300 as an exemplary way of controlling the DC voltage level of the preamp stage 102 outputs 116 (also labeled Von1 and Vop1). As shown, a reference voltage 301 (also labeled Vref) is provided to an op amp 302. When the feedback loop 300 senses that the DC voltage level of Von1 and Vop1 is too high (e.g., above a predetermined threshold), the feedback loop 300 increases the gate voltage of an exemplary short channel device 120 acting as a current source, resulting in a reduction of current injection, which lowers the voltage of Von1 and Vop1. Conversely, when the feedback loop 300 senses that the DC voltage level of Von1 and Vop1 is low (e.g., below a predetermined threshold), the feedback loop 300 decreases the gate voltage of the short channel device 120, resulting in an increase of current injection, which raises the voltage of Von1 and Vop1. As shown, various resistors 304 may be employed to decouple switching noise from Von1 and Vop1 to the short channel device 120, particularly for large resistance values 304.

In some examples, the feedback loop 300 may utilize a predetermined threshold that is a single value such that a voltage above the threshold results in reducing the current injection and a voltage below the threshold results in increasing the current injection. However, other examples may employ a feedback loop having separate thresholds. For example, a voltage above a first threshold results in reducing the current injection, while a voltage below a second, lower threshold results in increasing the current injection. In such an example, a voltage between the first and second thresholds may result in no change to the current injection. In examples that employ such a feedback loop 300, the DC voltage level of the preamp stage 102 output 116 is more precisely regulated (e.g., within several millivolts) even in the presence of variations introduced by process corners, power supply voltage, and even temperature fluctuations.

As explained above, the inclusion of diode-connected devices 114 between the preamp load 116 and ground 112 biases the output 116 of the preamp stage 102 to reduce dependence of the common mode output voltage 116 on power supply 110 voltage variation or noise. In some examples, the gain of the preamp-stage 102 may be controlled as shown in FIGS. 2a-c. In other examples, a feedback loop 300 may be included as shown in FIG. 3 to more precisely control the common mode output voltage 116 to not only be independent from power supply 110 variation, but also to be independent of variations introduced by process corners and operating temperature fluctuations.

Further, including a PMOS differential pair 104 in addition to the NMOS differential pair 106 allows current through the preamp stage 102 to be effectively reused to provide an increased transconductance for the preamp stage 102 (and correspondingly increased bandwidth) for a given current or power consumption. Alternately, a similar transconductance may be provided for the preamp stage 102 but with a current or power consumption reduced by approximately half.

Figure 4A:
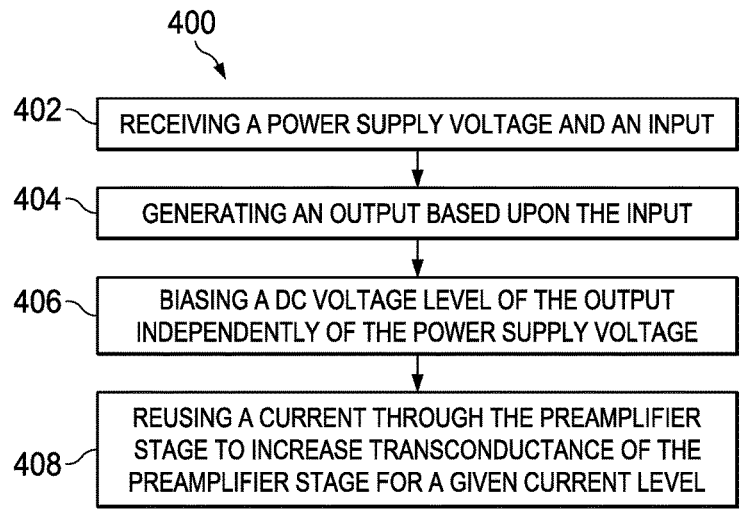
FIGS. 4a and 4b show flow charts of a method in accordance with various examples.

FIG. 4a shows a flow chart of a method 400 in accordance with various examples. The method 400 begins in block 402 with receiving a power supply voltage and an input and in block 404 with generating an output based upon the input. As explained above, a preamp stage 102 receives an input signal 108 and a voltage from power supply 110. In prior art designs, an output 116 was coupled to the power supply 110, and thus noise or variation in the power supply 110 influenced the output 116, increasing overall noise of the preamp stage 102 and subsequent amplifier stages such as telescopic amplifier 130.

However, in accordance with various examples of the present disclosure, the method 400 continues in block 406 with biasing a DC voltage level of the output independently of the power supply voltage. As explained above, a diode-connected device 114 or other biasing device is coupled between the preamp stage 102 common mode output or load 116, which biases the common mode output 116 independently of the power supply 110. As a result of providing a substantially constant biased output, overall noise of the preamplifier stage is reduced. The method 400 continues in block 408 with reusing a current through the preamplifier stage, which increases a transconductance of the preamplifier stage for a given current level. For example, the complementary circuit includes a PMOS differential pair 104 coupled the power supply 110 side and an NMOS differential pair 106 coupled to the ground 112 side. Improvements in CMOS technology have resulted in PMOS devices that display transconductance and parasitic behavior similar to their NMOS counterparts even when operated at high speeds (e.g., approaching 1 GHz or higher). Thus, the PMOS differential pair 104 is employed to boost transconductance (and corresponding bandwidth) of the preamp stage 102 without increasing current or power consumption. Alternately, a similar transconductance may be provided while enjoying a reduction in current or power consumption by approximately half.

Figure 4B:
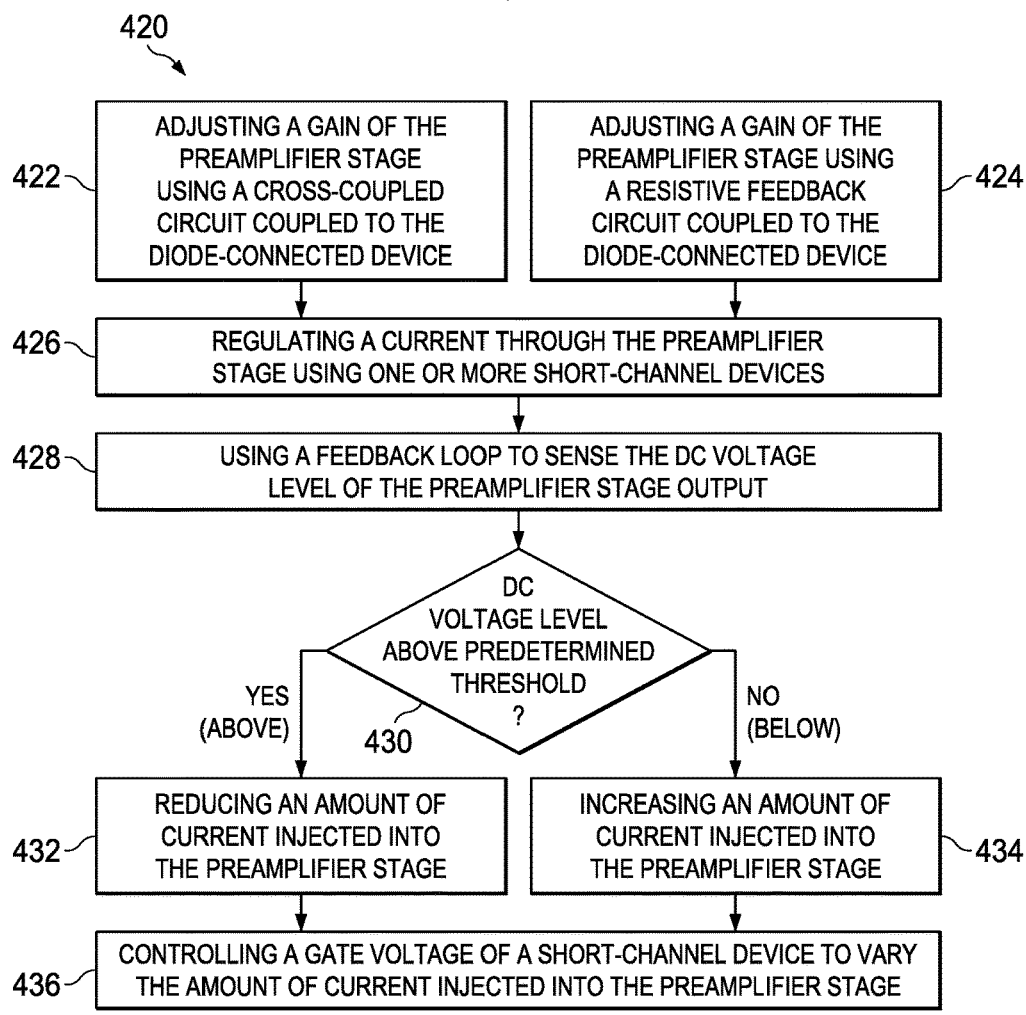

Turning now to FIG. 4b, additional, optional steps are shown in method 420. The optional steps 420 may begin in either block 422 or 424 with adjusting a gain of the preamplifier stage using a cross-coupled circuit coupled to the diode-connected device or a resistive feedback circuit coupled to the diode-connected device, respectively. Then, the method 420 may continue with regulating a current through the preamplifier stage using one or more short-channel devices in block 426. In some examples, the method 420 also includes using a feedback loop to sense the DC voltage level of the preamplifier stage output as in block 428. If the DC voltage level is above a predetermined threshold (block 430), then the method 420 continues in block 432 with reducing an amount of current injected into the preamplifier stage. However, if the DC voltage level is above the predetermined threshold (block 430), then the method 420 continues in block 434 with increasing an amount of current injected into the preamplifier stage. In either event, the method 420 may further continue in block 436 with controlling a gate voltage of a short-channel device to vary the amount of current injected into the preamplifier stage. By providing such a feedback control methodology, the DC voltage level of the output may be maintained at a substantially constant level, even where process corners, thermal conditions, or power supply introduce variations to the preamplifier stage.

Figure 5:
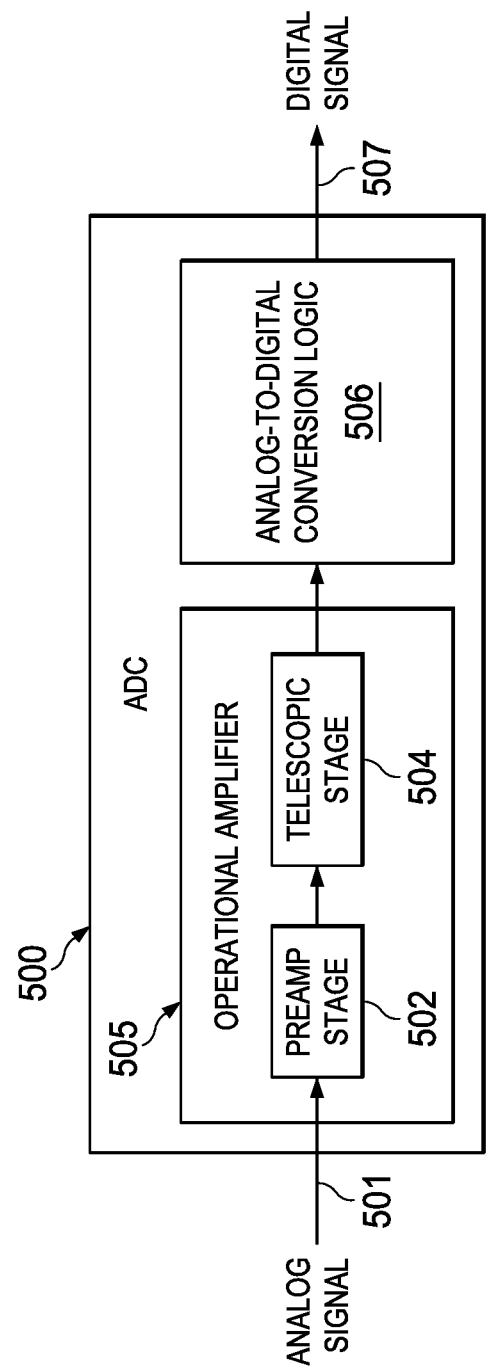
FIG. 5 shows an exemplary block diagram of an analog-to-digital converter that utilizes a preamplifier stage in accordance with various examples.

FIG. 5 shows an example ADC 500 in accordance with various embodiments. The ADC 500 includes an operational amplifier 505 having a preamp stage 502 and a telescopic stage 504. In certain examples, the ADC 500 may include more than one operational amplifier 505 arranged in a staged manner. The ADC 500 receives an analog signal 501 as input, which is passed to the operational amplifier 505 for amplification. The operational amplifier 505 then passes the amplified signal to an analog-to-digital conversion logic block 506, which generates a digital signal 507 as an output of the ADC 500. It should be appreciated that the analog-to-digital conversion logic block 506 may include one or more sub-ADC blocks and a flash ADC block as a final stage, both of which generate a digital output. Further, the analog-to-digital conversion logic block 506 may include a number of shifted registers, digital error correction logic, and other logic to be utilized in producing the digital signal 507 as output based on the received, amplified analog signal 501.

The preamp stage 502 of the operational amplifier 505 may comprise elements similar to the various disclosed preamp stage examples above in FIGS. 1-3. As explained above, the disclosed preamp stage 502 provides a more stabilized output voltage that is less dependent on a voltage of a power supply for the preamp stage 502, and thus reduces the transmission of variations or noise from the power supply to a subsequent amplifier stage such as the telescopic stage 502, or another operational amplifier 505 in the case where multiple operational amplifiers 505 are arranged in a staged manner. Further, the preamp stage 502 provides an increased transconductance relative to prior art designs without a corresponding increase in current consumption. In other examples of the present disclosure, the preamp stage 502 provides a comparable transconductance but with a reduced current consumption relative to prior art designs. A greater transconductance for a given amount of current or power consumption results in a correspondingly increased DC gain for the preamp stage 502, which in turn results in a larger operational amplifier 505 bandwidth without a corresponding increase in power consumption. Of course, in other examples the preamp stage 502 allows for an operational amplifier 505 bandwidth similar to prior art designs, but with reduced power consumption for the given bandwidth.

In particular, and as explained above, the preamp stage 502 utilize a complementary design that utilizes both PMOS and NMOS devices to provide an increase in transconductance of the preamp stage 502 (and thus amplifier 505 bandwidth) for a given current or power consumption. Further, the preamp stage 502 employs a diode-connected device between the preamp load and ground, which biases the output of the preamp stage 502 to reduce common mode output voltage dependence on power supply voltage variation or noise. That is, the output of the preamp stage 502 is biased independently of the power supply. Thus, the preamp stage 502 allows for an improved SNR for the ADC 500 while also permitting an increased amplifier 505 bandwidth without an increase in power consumption or, in alternate examples, a corresponding amplifier 505 bandwidth to a prior art design but with a reduction in power consumption, in some cases by up to half.

The above discussion is meant to be illustrative of the principles and various examples of the present invention. Numerous variations and modifications will become apparent to those skilled in the art once the above disclosure is fully appreciated. It is intended that the following claims be interpreted to embrace all such variations and modifications.

What is claimed is:

1. An apparatus comprising:
    a preamplifier stage including:
        an output;
        a current source;
        a PMOS differential pair coupled to a power supply side of the preamplifier stage, sources of the PMOS differential pair being coupled to the current source;
        an NMOS differential pair coupled to a ground side of the preamplifier stage, drains of the NMOS differential pair being coupled to respective drains of the PMOS differential pair at the output;
        a diode-connected device coupled to the output and ground; and
        a cross-coupled circuit coupled to the diode-connected device to adjust a gain of the preamplifier stage;
    wherein in the gain of the preamplifier is given by a ratio of a transconductance of the PMOS differential pair and the NMOS differential pair to a transconductance of the diode-connected device divided by N−1 where N is a ratio of size of the diode-connected device to the cross-coupled circuit.

2. The apparatus of claim 1 wherein the preamplifier stage further comprises one or more short-channel devices to regulate the current through the preamplifier stage.

3. The apparatus of claim 2 wherein the preamplifier stage further comprises a resistive feedback circuit coupled to the diode-connected device to adjust a gain of the preamplifier stage.

4. The apparatus of claim 1 further comprising a feedback loop coupled to the preamplifier stage, the feedback loop to:
    sense a DC voltage level of the output;
    if the DC voltage level is above a predetermined threshold, reduce an amount of current injected to the preamplifier stage; and
    if the DC voltage level is below a predetermined threshold, increase an amount of current injected into the preamplifier stage;
    wherein the reduction in current injected results in a decrease of the DC voltage level of the output and the increase in current injected results in an increase of the DC voltage level.

5. The apparatus of claim 4 wherein the feedback loop controls a gate voltage of a short-channel device to vary the amount of current injected into the preamplifier stage.

6. The apparatus of claim 4 wherein the DC voltage level maintained by the feedback loop is substantially constant in varying thermal conditions.

* * * * *